United States Patent
Sakashita et al.

(10) Patent No.: US 7,759,846 B2
(45) Date of Patent: Jul. 20, 2010

(54) PIEZOELECTRIC DEVICE, PROCESS FOR DRIVING FOR DRIVING THE PIEZOELECTRIC DEVICE, AND PIEZOELECTRIC ACTUATOR

(75) Inventors: Yukio Sakashita, Kanagawa-ken (JP); Tsutomu Sasaki, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 249 days.

(21) Appl. No.: 12/118,461

(22) Filed: May 9, 2008

(65) Prior Publication Data

US 2008/0297005 A1    Dec. 4, 2008

(30) Foreign Application Priority Data

May 14, 2007    (JP)    ............................. 2007-128412

(51) Int. Cl.
*H01L 41/08*    (2006.01)
(52) U.S. Cl. ...................................... 310/358; 310/324
(58) Field of Classification Search ................. 310/311, 310/324, 328, 358
See application file for complete search history.

(56) References Cited

U.S. PATENT DOCUMENTS

| | | | | |
|---|---|---|---|---|
| 6,437,486 B1 * | 8/2002 | Burcsu et al. | ............... | 310/358 |
| 7,352,113 B2 * | 4/2008 | Nagaya et al. | ............... | 310/358 |
| 7,521,845 B2 * | 4/2009 | Ifuku et al. | ................. | 310/358 |
| 7,567,021 B2 * | 7/2009 | Tanaka et al. | ............... | 310/330 |
| 2003/0048042 A1 * | 3/2003 | Yamaguchi et al. | ......... | 310/328 |
| 2004/0232803 A1 * | 11/2004 | Matsushita et al. | .......... | 310/358 |
| 2008/0074471 A1 * | 3/2008 | Sakashita et al. | .............. | 347/68 |

FOREIGN PATENT DOCUMENTS

| | | |
|---|---|---|
| JP | 2000-326506 A | 11/2000 |
| JP | 3568107 B2 | 6/2004 |

OTHER PUBLICATIONS

S. E. Park et al., "Ultrahigh strain and piezoelectric behavior in relaxor based ferroelectric single crystals," Journal of Applied Physics, vol. 82, No. 4, pp. 1804-1811, 1997.

* cited by examiner

*Primary Examiner*—Mark Budd
(74) *Attorney, Agent, or Firm*—Birch, Stewart, Kolasch & Birch, LLP

(57) ABSTRACT

A piezoelectric device constituted by a piezoelectric body and electrodes. The piezoelectric body is a monocrystalline piezoelectric film formed, above a substrate, of an inorganic crystalline compound containing a first ferroelectric crystal when no electric field is applied to the piezoelectric film, and having a characteristic that phase transition of at least a portion of the first ferroelectric crystal to a second ferroelectric crystal occurs when the electric field strength applied to the piezoelectric film is at or above a predetermined level E1, the first and second ferroelectric crystals correspond to different crystal systems, and the piezoelectric device is driven under a condition that the minimum strength Emin, the maximum strength Emax, and the predetermined level E1 of the applied electric field satisfy the inequalities, Emin<E1<Emax.

22 Claims, 8 Drawing Sheets

FIG.1
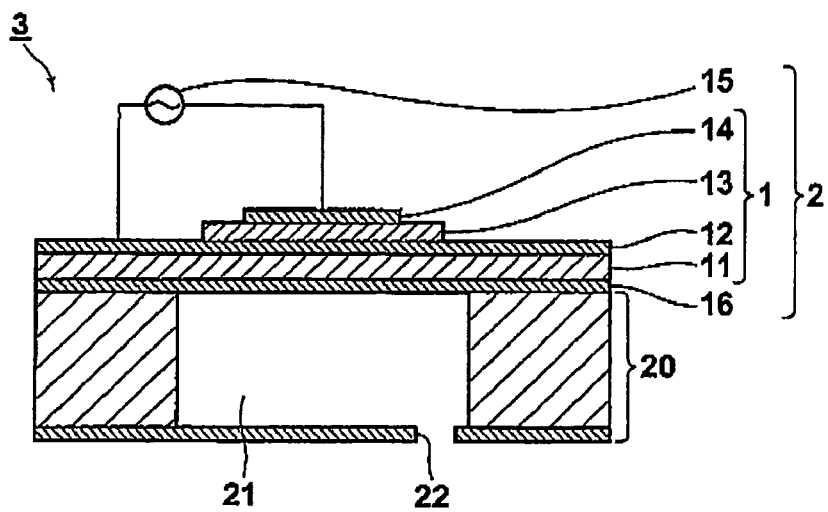
FIG.2 PHASE-TRANSITION REGION
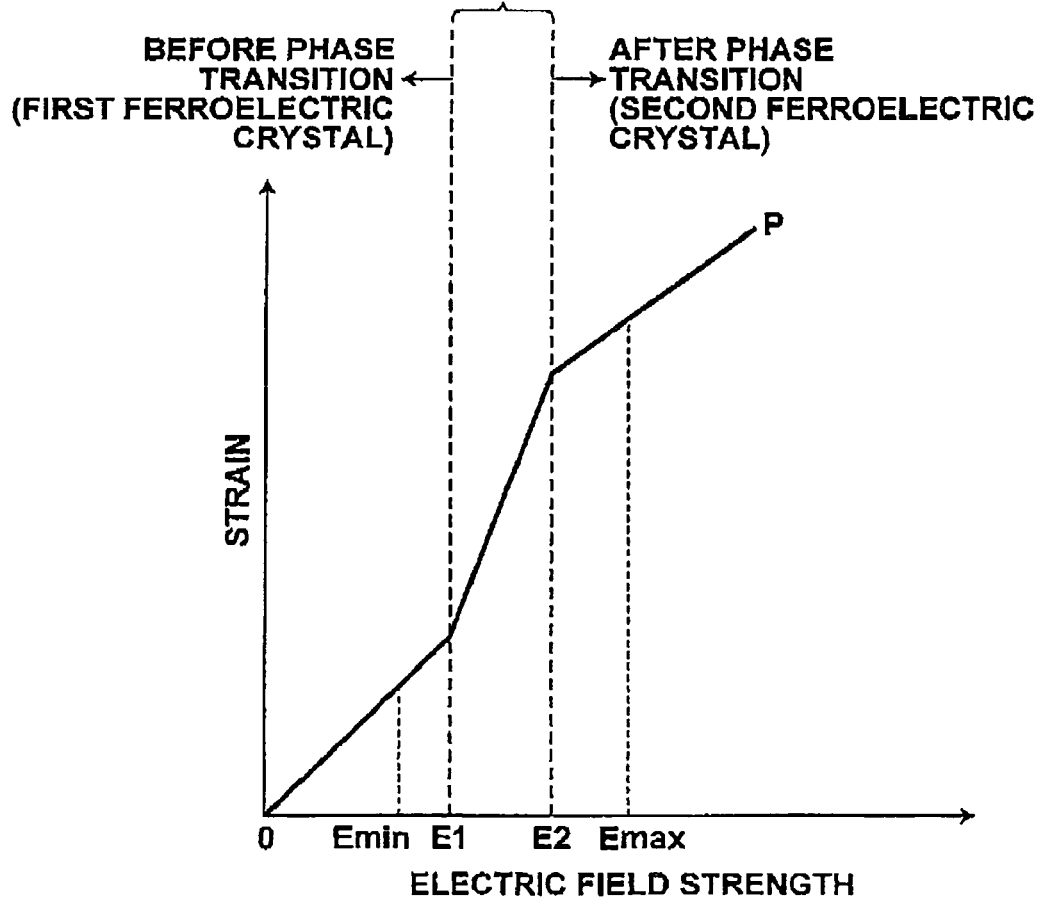

XRD RESULT OF CONCRETE EXAMPLE 2

CROSS-SECTIONAL TEM MICROGRAPH OF CONCRETE EXAMPLE 2

FIG.10 ELECTRON-BEAM DIFFRACTION PATTERN OF CONCRETE EXAMPLE 2 AT [100] INCIDENCE
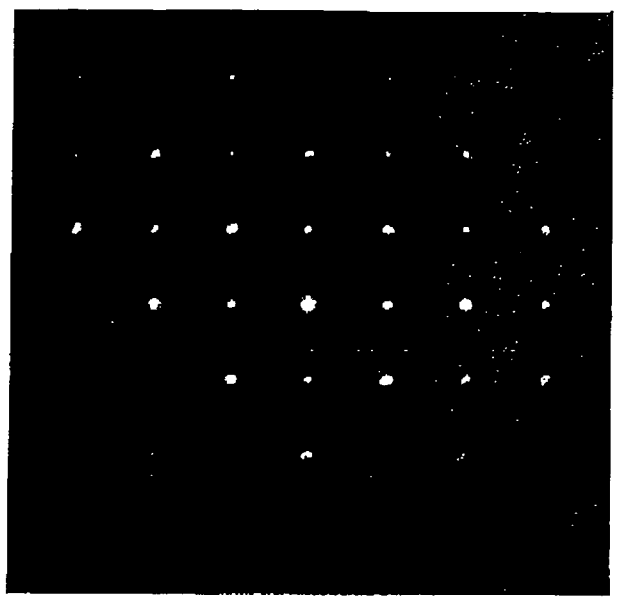
FIG.11 XRD PEALE SHIFT VS. APPLIED VOLTAGE IN CONCRETE EXAMPLE 2
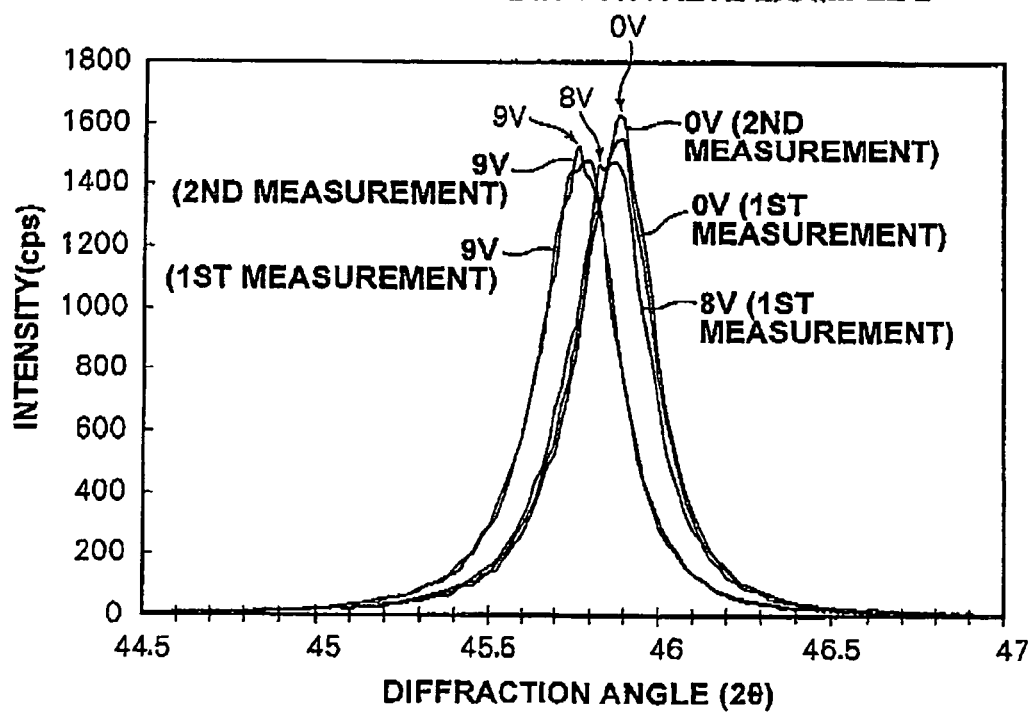

PIEZOELECTRIC DEVICE, PROCESS FOR DRIVING FOR DRIVING THE PIEZOELECTRIC DEVICE, AND PIEZOELECTRIC ACTUATOR

BACKGROUND OF THE INVENTION

1. Field of the Invention

The present invention relates to a piezoelectric device having a piezoelectric body and a characteristic crystalline structure, and a process for driving the piezoelectric device under an appropriate condition. The present invention also relates to a piezoelectric actuator having the above piezoelectric device and a means for controlling the piezoelectric device, and a liquid discharge device using the piezoelectric device.

2. Description of the Related Art

Currently, piezoelectric devices constituted by a piezoelectric body and electrodes are used as, for example, actuators installed in inkjet recording heads. In the piezoelectric devices, the piezoelectric body expands and contracts according to increase and decrease in the strength of an electric field applied from the electrodes to the piezoelectric body along a predetermined direction. For example, complex compounds having a perovskite structure such as PZT (lead titanate zirconate) are known as materials suitable for the piezoelectric body. Such materials are ferroelectric materials which exhibit spontaneous polarization even when no electric field is applied to the materials.

The conventional piezoelectric devices commonly utilize only the so-called piezoelectric effect. The piezoelectric effect is a phenomenon in which a piezoelectric body expands along a polarization axis when an electric field is applied to the piezoelectric body along the polarization axis. (Hereinafter, the conventional piezoelectric devices utilizing only the above piezoelectric effect are referred to as the first type of conventional piezoelectric devices.) Therefore, it has been conventionally considered important that the material of the piezoelectric body be designed so that the orientation of the polarization axis coincides with the direction of the applied electric field.

However, the magnitude of strain which can be achieved by use of only the conventional piezoelectric effect as in the first type of conventional piezoelectric devices is limited, so that demands for greater strain are increasing.

On the other hand, since the size and weight of the electronic devices are decreasing and the functions of the electronic devices are being sophisticated, development of the piezoelectric devices for reducing the size and weight of the piezoelectric devices and improving the functions of the piezoelectric devices are proceeding. For example, in the field of the inkjet recording heads, techniques for increasing the density of arrangement of piezoelectric devices are currently being studied in order to improve image quality. For this purpose, techniques for reducing the thicknesses of the piezoelectric bodies in the producing piezoelectric devices are also being studied. Even when the magnitude of the voltage applied to a piezoelectric body is unchanged, the strength of the electric field applied to the piezoelectric body is increased with decrease in the thickness of the piezoelectric body. Therefore, sufficient piezoelectric performance cannot be achieved by the conventional material design.

As conventionally known, in the case where only the conventional piezoelectric effect contributes to the strain in a ferroelectric substance (as in the first type of conventional piezoelectric devices), the piezoelectric characteristic of the ferroelectric substance (i.e., the relationship between the strength of the applied electric field and the magnitude of strain in the ferroelectric substance) is as indicated by the thick solid curve Q in FIG. 6. The curve Q indicates that the magnitude of strain in the ferroelectric substance linearly increases with increase in the strength of the electric field (i.e., the electric field strength) until the electric field strength reaches a certain level Ex. However, when the electric field strength exceeds the certain level Ex, the increase in the magnitude of strain is greatly reduced and the magnitude of strain is almost saturated.

Therefore, conventionally, the first type of conventional piezoelectric devices have been used within the range of the electric field strength from 0 to Ex (in which the magnitude of strain in the ferroelectric substance linearly increases with increase in the electric field strength). Although the level Ex of the electric field strength and the maximum electric field strength depend on the material (composition) of the ferroelectric substance, for example, the level Ex of the electric field strength is approximately 5 to 100 kV/cm, and the maximum electric field strength is conventionally approximately 0.1 to 10 kV/cm. However, in the case where the thickness of the piezoelectric device is reduced, the electric field strength applied to the piezoelectric body increases even when the magnitude of the voltage applied to the piezoelectric device is unchanged. Therefore, the piezoelectric devices are obliged to be used, for example in the range of the electric field strength from 0 to Ey, where Ey>Ex as indicated in FIG. 6. In this case, the effective piezoelectric constant in the range of the electric field strength from 0 to Ey (which is indicated by the gradient Q' in FIG. 6) is smaller than the piezoelectric constant in the range of the electric field strength from 0 to Ex, so that the piezoelectric performance which the piezoelectric devices intrinsically have is not sufficiently delivered.

In particular, in the case where a piezoelectric device the thickness of which is reduced is used in such a manner that the difference between the minimum electric field strength and the maximum electric field strength is unchanged from the conventional piezoelectric devices the thickness of which is not reduced, for example, in the case where the piezoelectric device with the reduced thickness is used in the range from Ex to Ey, the magnitude of strain can vary by only a very small amount, so that the piezoelectric device cannot sufficiently deliver the function which the piezoelectric device is required to have.

In the above circumstances, the Japanese Patent No. 3568107 (hereinafter referred to as JP3568107) proposes a second type of conventional piezoelectric device, in which application of an electric field causes phase transition in a piezoelectric body. JP3568107 discloses a piezoelectric device constituted by a phase-transition film, electrodes, and a heating body, where the heating body adjusts the temperature of the phase-transition film to a level near to the Curie point Tc. (See "claim 1" in JP3568107.) JP3568107 discloses as the phase-transition film a film in which transition occurs between a tetragonal phase and a rhombohedral phase or between a cubic phase and a tetragonal or rhombohedral phase. (See "claim 2" in JP3568107.) Further, JP3568107 reports that the second type of conventional piezoelectric device disclosed in JP3566107 can achieve greater strain than the first type of conventional piezoelectric devices because both of the piezoelectric effect of the ferroelectric material and the change in the crystal structure associated with the phase transition contribute to the magnitude of strain in the second type of conventional piezoelectric device.

As explained above, JP3568107 refers to the use, as the phase-transition film, of a film in which phase transition occurs between a tetragonal system and a rhombohedral system, and a film in which phase transition occurs between a cubic system and a tetragonal or rhombohedral system, where both of the tetragonal and rhombohedral phases exhibit ferroelectric properties, and the cubic phase exhibit paraelectric properties. However, the piezoelectric device disclosed in JP3568107 is supposed to be used in the vicinity of the Curie point Tc. Since the Curie point Tc corresponds to the phase-transition temperature between the ferroelectric phase and the paraelectric phase, the phase transition between the tetragonal phase and the rhombohedral phase occurs in no film used in the vicinity of the Curie point Tc. That is, the piezoelectric device disclosed in JP3568107 cannot take advantage of the phase transition other than the phase transition between the ferroelectric phase and the paraelectric phase. In addition, since spontaneous polarization does not occur in the paraelectric material, the piezoelectric device disclosed in JP3568107 does not exhibit the piezoelectric effect of expansion in the direction of the polarization in response to application of an electric field after the phase transition.

Further, FIG. 6 also schematically indicates the piezoelectric characteristic of the second type of conventional piezoelectric device by the curve R. In order to clarify the difference of the piezoelectric device according to the second type of conventional technique from the first type of conventional piezoelectric device, the essentially identical portions of the piezoelectric characteristics of the first and second types of conventional piezoelectric devices in the range of the electric field strength from 0 to E1 are indicated by the common solid line, which is a portion of the curve Q, where the phase transition begins at the electric field strength E1. That is, the conventional piezoelectric effect makes the magnitude of strain in the piezoelectric device linearly increase with increase in the electric field strength until the phase transition begins at the electric field strength E1. In the range of the electric field strength from E1 to E2, the change in the crystal structure makes the magnitude of strain increase with increase in the electric field strength, where the phase transition to the paraelectric phase is substantially completed at the electric field strength E2. In the range of the electric field strength above E2, the magnitude of strain does not increase with increase in the electric field strength since the piezoelectric effect of the ferroelectric substance does not work in the paraelectric phase.

In the case where the thickness of the second type of conventional piezoelectric device is reduced, the second type of conventional piezoelectric device is also obliged to operate in the range of the electric field strength which includes the range in which the electric field strength is high and the magnitude of strain does not increase with increase in the electric field strength. Therefore, the second type of conventional piezoelectric device cannot effectively deliver the function which the piezoelectric device is required to have, as the first type of conventional piezoelectric devices.

SUMMARY OF THE INVENTION

The present invention has been made in view of such circumstances.

The first object of the present invention is to provide a piezoelectric device which can stably produce a great magnitude of strain, and the thickness of which can be reduced.

The second object of the present invention is to provide a process for driving a piezoelectric device which can stably produce a great magnitude of strain, and the thickness of which can be reduced.

The third object of the present invention is to provide a piezoelectric actuator having the piezoelectric device achieving the first object and a means for controlling the piezoelectric device.

The fourth object of the present invention is to provide a liquid discharge device using the piezoelectric device achieving the first object.

(I) In order to accomplish the above first object, a piezoelectric device according to the first aspect of the present invention is provided. The piezoelectric device according to the first aspect of the present invention comprises a piezoelectric body, and electrodes through which an electric field is applied to the piezoelectric body along a predetermined direction. The piezoelectric device according to the first aspect of the present invention is characterized in that the piezoelectric body is a monocrystalline film formed, above a substrate, of an inorganic crystalline compound containing a first ferroelectric crystal when no electric field is applied to the piezoelectric body, and having a characteristic that phase transition of at least a portion of the first ferroelectric crystal to a second ferroelectric crystal occurs when the strength of the electric field is at or above a predetermined level E1, the first ferroelectric crystal and the second ferroelectric crystal have structures corresponding to different crystal systems, and the piezoelectric device is driven under a condition that the minimum strength Emin, the maximum strength Emax, and the predetermined level E1 of the electric field applied to the piezoelectric body satisfy the inequalities, $$Emin < E1 < Emax. \tag{1}$$

In the piezoelectric device according to the first aspect of the present invention, when no electric field is applied to the piezoelectric body, the piezoelectric body may be realized by a monocrystal which is composed of only the first ferroelectric crystal, or a monocrystal or polycrystal which is composed of the first ferroelectric crystal and one or more other ferroelectric crystals corresponding to one or more crystal systems which are different from the crystal system of the first ferroelectric crystal. In addition, when no electric field is applied to the piezoelectric body, the first ferroelectric crystal may have a single-domain structure in which the orientations of the polarization axes are aligned or a multidomain structure constituted by a plurality of domains in which the orientations of polarization axes are different.

In the piezoelectric device according to the first aspect of the present invention, the change in the crystal structure associated with the phase transition in the piezoelectric body causes a volume change. In addition, the piezoelectric effect also works in the second ferroelectric crystal produced by the phase transition, as well as in the first ferroelectric crystal. Therefore, the contributions of all of the volume change and the piezoelectric effect in both of the first and second ferroelectric crystals produce great strain.

Further, since the piezoelectric body is a monocrystalline film formed above a substrate in the piezoelectric device according to the first aspect of the present invention, the phase transition from the first ferroelectric crystal to the second ferroelectric crystal stably proceeds, so that the great strain can be stably achieved. In addition, the use of the monocrystalline film as the piezoelectric body is advantageous in the variety of the material composition, ease of manufacture, cost, freedom of design, and the like, compared with the use of a bulk monocrystal as the piezoelectric body.

The piezoelectric device according to the first aspect of the present invention is driven in a range of the electric field strength up to or over the maximum electric field strength of the aforementioned first type of conventional piezoelectric devices which use a piezoelectric body having the same composition as the piezoelectric device according to the first aspect of the present invention. Since the electric field applied to a piezoelectric body having a reduced thickness is increased even when the magnitude of the voltage applied to the thin piezoelectric body is unchanged, the piezoelectric device according to the first aspect of the present invention is more effective when the thickness of the piezoelectric device is reduced.

Preferably, the piezoelectric device according to the first aspect of the present invention may further comprise one or any possible combination of the following additional features (a) to (g).

(a) It is preferable that the piezoelectric device according to the first aspect of the present invention be arranged to be driven under a condition that the minimum strength Emin, the maximum strength Emax, and the predetermined level E1 of the electric field applied to the piezoelectric body satisfy the inequalities, $$Emin < E1 \leqq E2 < Emax, \qquad (2)$$

where E2 represents the strength of the electric field at which the phase transition to the second ferroelectric crystal is substantially completed.

In this specification, "the strength of the electric field at which the phase transition is substantially completed" is such a electric field strength that the phase transition no longer occurs even when the electric field strength is further increased. In some cases, even when the electric field strength becomes higher than the strength E2, the phase transition does not occur in a portion of the first ferroelectric phase, so that the portion in the first ferroelectric phase remains.

(b) It is preferable that the first ferroelectric crystal have a polarization axis oriented along a direction different from the aforementioned predetermined direction (along which the electric field is applied to the piezoelectric body). In this case, it is particularly preferable that the second ferroelectric crystal have a polarization axis oriented along a direction approximately identical to the predetermined direction.

In this specification, the expression "approximately identical to the predetermined direction" means that the angular difference from the predetermined direction does not exceed 20 degrees.

As mentioned in the "Description of the Related Art," in the first type of conventional piezoelectric devices (which utilize only the conventional piezoelectric effect), it has been conventionally considered important that the material of the piezoelectric body be designed so that the orientation of the polarization axis coincides with the direction of the applied electric field. That is, if only the conventional piezoelectric effect of the ferroelectric material is utilized as in the first type of conventional piezoelectric devices, the electric field is applied to the piezoelectric body along the direction in which the polarization axis of the first ferroelectric crystal is oriented before the application of the electric field.

On the other hand, in contrast to the first type of conventional piezoelectric devices, in the piezoelectric device according to the first aspect of the present invention, it is preferable that the (predetermined) direction along which the electric field is applied to the piezoelectric body be differentiated from the orientation of the polarization axis of the first ferroelectric crystal. It is further preferable that the (predetermined) direction along which the electric field is applied to the piezoelectric body be approximately aligned with the orientation of the polarization axis of the second ferroelectric crystal. In such cases, the so-called engineered-domain effect and some other effects work, and the phase transition efficiently proceeds, so that it is possible to stably achieve relatively great strain.

The engineered-domain effect in a bulk monocrystal is explained by S. E. Park et al., "Ultrahigh strain and piezoelectric behavior in relax or based ferroelectric single crystals," Journal of Applied Physics, Vol. 82, No. 4, pp. 1804-1811, 1997.

The Park reference reports as the engineered-domain effect a phenomenon in which the magnitude of strain achieved by applying an electric field along a direction different from the orientation of the polarization axis of the first ferroelectric crystal (having a rhombohedral structure) of PZN-8% PT is greater than the magnitude of strain achieved by applying the electric field along the orientation of the polarization axis of the first ferroelectric crystal. FIG. 7 is a quote from "FIG. 17" in the Park reference, and shows the engineered-domain effect in a monocrystal of PZN-8% PT. The Park reference shows in "FIG. 17" that the ferroelectric crystal having the rhombohedral structure transitions to a crystal having a tetragonal structure when the magnitude of the voltage applied to the first ferroelectric crystal is further increased.

However, the Park reference disclose neither of the piezoelectric characteristics after phase transition, application to a film formed on a substrate, and the driving of a piezoelectric device under a condition in which the minimum electric field strength and the maximum electric field strength are limited within specific ranges. That is, although the Park reference discloses the engineered-domain effect in a bulk monocrystal, the Park reference does not refer to application to a film formed on a substrate, use in a piezoelectric device, and the like.

(c) It is preferable that the first ferroelectric crystal have a crystal structure corresponding to a first one of tetragonal, orthorhombic, monoclinic, and rhombohedral crystal systems, the second ferroelectric crystal have a crystal structure corresponding to a second one of tetragonal, orthorhombic, monoclinic, and rhombohedral crystal systems, and the first one of the tetragonal, orthorhombic, monoclinic, and rhombohedral crystal systems be different from the second one of the tetragonal, orthorhombic, monoclinic, and rhombohedral crystal systems.

The polarization axes of the ferroelectric crystals having crystal structures corresponding to the tetragonal, orthorhombic, and rhombohedral systems are respectively oriented along the <001>, <110>, and <111> axes, and the electric field is normally applied along a direction perpendicular to the upper surface of the piezoelectric film (i.e., the direction of crystal orientation).

Therefore, in the case where the first and second ferroelectric crystals are in one of the following combinations (c1) to (c6), it is possible to align the direction of the applied electric field (i.e., the direction of crystal orientation) approximately with the orientation of the polarization axis of the second ferroelectric crystal after the phase transition.

(c1) The first ferroelectric crystal is a rhombohedral crystal oriented approximately along the <001> direction, and the second ferroelectric crystal is a tetragonal crystal.

(c2) The first ferroelectric crystal is a tetragonal crystal oriented approximately along the <111> direction, and the second ferroelectric crystal is a rhombohedral crystal.

(c3) The first ferroelectric crystal is an orthorhombic crystal oriented approximately along the <001> direction, and the second ferroelectric crystal is a tetragonal crystal.

(c4) The first ferroelectric crystal is a tetragonal crystal oriented approximately along the <110> direction, and the second ferroelectric crystal is an orthorhombic crystal.

(c5) The first ferroelectric crystal is a rhombohedral crystal oriented approximately along the <110> direction, and the second ferroelectric crystal is an orthorhombic crystal.

(c6) The first ferroelectric crystal is an orthorhombic crystal oriented approximately along the <111> direction, and the second ferroelectric crystal is a rhombohedral crystal.

In this specification, the first ferroelectric crystal is defined as being oriented approximately along an <abc> direction when the <abc> axis of the first ferroelectric crystal is approximately perpendicular to the surface of the substrate.

(d) It is preferable that the piezoelectric body be composed of one or more perovskite oxides, although the piezoelectric body may further contain inevitable impurities. In this case, it is particularly preferable that each of the one or more perovskite oxides have composition expressed by a compositional formula $ABO_3$, where A represents one or more A-site elements which are one or more of Pb, Ba, La, Sr, Bi, Li, Na, Ca, Cd, Mg, K, and the lanthanide elements, B represents one or more B-site elements which are one or more of Ti, Zr, V, Nb, Ta, Cr, Mo, W, Mn, Sc, Co, Cu, In, Sn, Ga, Zn, Cd, Fe, and Ni, and O represents oxygen. Although the ratio of each of the total molar amount of atoms of the one or more A-site elements and the total molar amount of atoms of the one or more B-site elements to the molar amount of oxygen atoms in each of the one or more perovskite oxides is normally 1:3, the ratio may deviate from 1:3 within a range in which a perovskite structure can be formed.

(e) It is preferable that the phase transition of the at least a portion of the first ferroelectric crystal to the second ferroelectric crystal occur at the temperature range of −50° C. to 200° C.

(f) It is preferable that the piezoelectric film have a thickness of 20 micrometers or smaller.

(g) It is preferable that the inorganic crystalline compound further have an additional characteristic that phase transition of at least a portion of the second ferroelectric crystal to a third ferroelectric crystal occurs when the strength of the electric field is further increased after the phase transition of the at least a portion of the first ferroelectric crystal to the second ferroelectric crystal occurs, where the second ferroelectric crystal and the third ferroelectric crystal have structures corresponding to different crystal systems.

(II) In order to accomplish the second object, a process according to the second aspect of the present invention for driving a piezoelectric device is provided, where the piezoelectric device is constituted by a piezoelectric body, and electrodes through which an electric field is applied to the piezoelectric body along a predetermined direction. The process according to the second aspect of the present invention is characterized in that the piezoelectric device is driven under a condition that the minimum strength Emin and the maximum strength Emax of the electric field applied to the piezoelectric body and a predetermined level E1 of the electric field satisfy the inequalities, $$Emin < E1 < Emax; \text{ and} \quad (1)$$

where the piezoelectric body is a monocrystalline film formed, above a substrate, of an inorganic crystalline compound containing a first ferroelectric crystal when no electric field is applied to the piezoelectric body, and having a characteristic that phase transition of at least a portion of the first ferroelectric crystal to a second ferroelectric crystal occurs when the strength of the electric field is at or above the predetermined level E1, and the first ferroelectric crystal and the second ferroelectric crystal have structures corresponding to different crystal systems.

In the process according to the second aspect of the present invention, it is preferable that the piezoelectric device be driven under a condition that the minimum strength Emin, the maximum strength Emax, and the predetermined level E1 of the electric field applied to the piezoelectric body satisfy the inequalities, $$Emin < E1 \leq E2 < Emax, \quad (2)$$

where E2 represents the strength of the electric field at which the phase transition to the second ferroelectric crystal is substantially completed.

(III) In order to accomplish the third object, a piezoelectric actuator according to the third aspect of the present invention is provided. The piezoelectric actuator according to the third aspect of the present invention comprises a piezoelectric device and a controller for controlling driving of the piezoelectric device, and the piezoelectric device includes a piezoelectric body, and electrodes through which an electric field is applied to the piezoelectric body along a predetermined direction. The piezoelectric actuator is characterized in that the piezoelectric body is a monocrystalline film formed, above a substrate, of an inorganic crystalline compound containing a first ferroelectric crystal when no electric field is applied to the piezoelectric body, and having a characteristic that phase transition of at least a portion of the first ferroelectric crystal to a second ferroelectric crystal occurs when the strength of the electric field is at or above a predetermined level E1, the first ferroelectric crystal and the second ferroelectric crystal have structures corresponding to different crystal systems, and the controller drives the piezoelectric device under a condition that the minimum strength Emin, the maximum strength Emax, and the predetermined level E1 of the electric field applied to the piezoelectric body satisfy the inequalities, $$Emin < E1 < Emax. \quad (1)$$

In the piezoelectric actuator according to the third aspect of the present invention, it is preferable that the controller drive the piezoelectric device under a condition that the minimum strength Emin, the maximum strength Emax, and the predetermined level E1 of the electric field applied to the piezoelectric body satisfy the inequalities, $$Emin < E1 \leq E2 < Emax, \quad (2)$$

where E2 represents the strength of the electric field at which the phase transition to the second ferroelectric crystal is substantially completed.

(IV) In order to accomplish the fourth object, a liquid discharge device according to the fourth aspect of the present invention is provided. The liquid discharge device according to the fourth aspect of the present invention comprises the piezoelectric device according to the first aspect of the present invention, and a reserve-and-discharge member. The reserve-and-discharge member includes a liquid-reserve chamber which reserves liquid, and a liquid-discharge outlet through which the liquid is discharged from the liquid-reserve chamber.

In the liquid discharge device according to the fourth aspect of the present invention, it is preferable that the piezoelectric device be driven under a condition that the minimum, strength Emin, the maximum strength Emax, and the predetermined level E1 of the electric field applied to the piezoelectric body satisfy the inequalities, $$Emin < E1 \leq E2 < Emax, \quad (2)$$

where E2 represents the strength of the electric field at which the phase transition to the second ferroelectric crystal is substantially completed.

DESCRIPTION OF THE DRAWINGS

FIG. 1 is a cross-sectional view schematically illustrating a cross section of an essential portion of an inkjet recording head (as a liquid discharge device) having a piezoelectric device according to an embodiment of the present invention.

FIG. 2 is a diagram schematically indicating a piezoelectric characteristic of a piezoelectric body in the piezoelectric device illustrated in FIG. 1.

FIG. 10 is a diagram indicating an electron-beam diffraction pattern of the piezoelectric film in the concrete example 2.

FIG. 11 is a diagram indicating the shift of a peak observed in XRD measurement of the piezoelectric film in the concrete example 2 which is performed while changing an electric field applied to the piezoelectric film.

DESCRIPTION OF PREFERRED EMBODIMENTS

Figure 3:
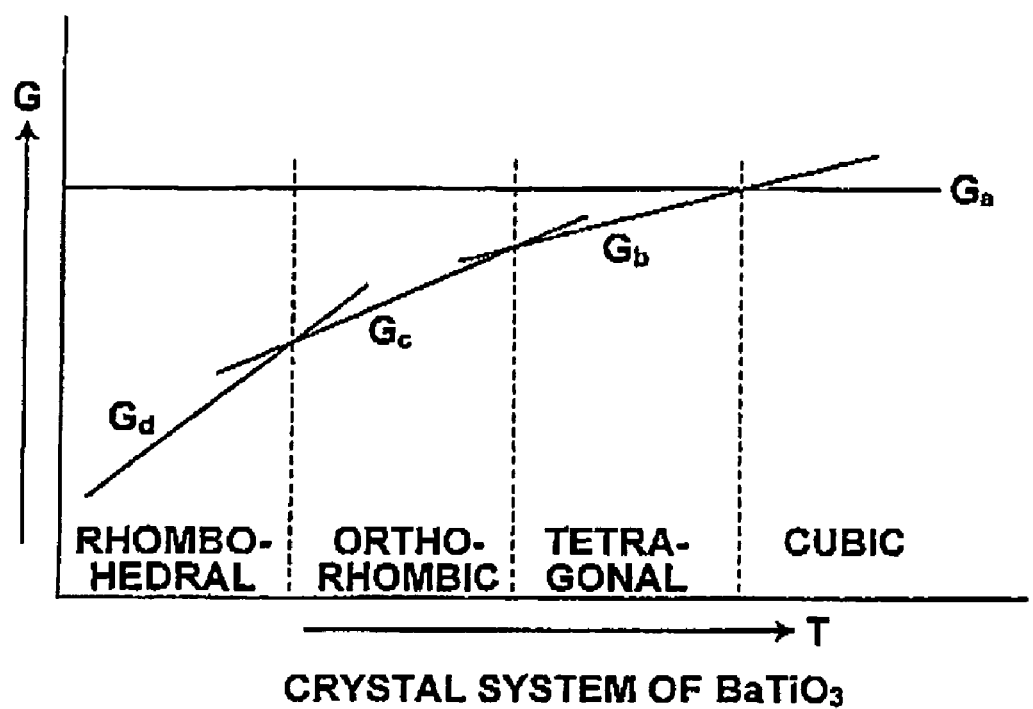
FIG. 3 is a diagram schematically indicating relationships between the temperature and the Gibbs free energy (and the crystal structure) of barium titanate.

A preferred embodiment of the present invention is explained in detail below with reference to drawings.

1. PIEZOELECTRIC DEVICE AND INKJET RECORDING HEAD

Hereinbelow, the structures of a piezoelectric device, a piezoelectric actuator using the piezoelectric device, and an inkjet recording head (as a liquid discharge device) using the piezoelectric device are explained with reference to FIG. 1, which schematically shows a cross section of an essential portion of the inkjet recording head containing the piezoelectric device, where the cross section is parallel to the thickness direction of the piezoelectric device. In FIG. 1, the respective elements are illustrated schematically, and the dimensions of the illustrated elements are differentiated from the dimensions of the elements in the actual system, for clear illustration.

As illustrated in FIG. 1, the inkjet recording head 3 contains a piezoelectric actuator 2, which is realized by using the piezoelectric device 1. The piezoelectric device 1 is a device produced by forming on a substrate 11 a lower electrode 12, a piezoelectric body 13, and an upper electrode 14 in this order. The piezoelectric body 13 is a monocrystal having a piezoelectric characteristic and being formed of an inorganic compound. An electric field is applied to the piezoelectric body 13 through the lower electrode 12 and the upper electrode 14.

The substrate 11 may be formed of a monocrystal of a semiconductor such as silicon, gallium arsenide, or iridium phosphide, or a monocrystal of an oxide such as magnesia, magnesia spinel, sapphire, strontium titanate, lanthanum aluminate, or neodymium gallate. Alternately, the substrate 11 may be realized by a laminated substrate such as the SOI (silicon-on-insulator) substrate, which is produced by forming on a surface of a silicon substrate an oxide film of $SiO_2$ and a Si active layer in this order.

In addition, the main component of the lower electrode 12 must be a material which can epitaxially grow and well lattice-match with the substrate, and may be, for example, one or a combination of metals such as Pt and Ir and metal oxides such as $LaNiO_3$, and $SrRuO_3$. Further, the main component of the upper electrodes 14 is not specifically limited, and may be, for example, one or a combination of the same materials as the above examples of the main component of the lower electrode 12 and other materials (such as Al, Ta, Cr, Cu, Au, $RuO_2$, $IrO_2$, and ITO (indium tin oxide)) which are generally used in the electrodes in the semiconductor processes. Furthermore, the thicknesses of the lower and upper electrodes 12 and 14 are not specifically limited, and are preferably 50 to 500 nm.

The piezoelectric actuator 2 comprises a diaphragm 16 and a controller 15 as well as the piezoelectric device 1. The diaphragm 16 is attached to the back surface of the substrate 11 so that the diaphragm 16 vibrates in correspondence with expansion and contraction of the piezoelectric body 13. The controller 15 includes a driver circuit and the like for driving the piezoelectric device 1.

The inkjet recording head 3 is produced by attaching an ink nozzle 20 to the back surface of the piezoelectric actuator 2. The ink nozzle 20 (corresponding to the aforementioned reserve-and-discharge member) is a member for reserving and discharging ink, and comprises an ink chamber 21 (as a liquid-reserve chamber) and an ink outlet 22 (as a liquid-discharge outlet). The ink chamber 21 reserves ink, and the ink held in the ink chamber 21 is discharged out of the ink chamber 21 through the ink outlet 22 connected to the ink chamber 21.

In the above inkjet recording head 3, the strength of the electric field applied to the piezoelectric device 1 is increased or decreased so as to expand or contract the piezoelectric body 13 and control the discharge and the discharge amount of the ink.

Alternatively, it is possible to process predetermined portions of the substrate 10 into the diaphragm 16 and the ink nozzle 20, instead of attaching the diaphragm 16 and the ink nozzle 20 to the piezoelectric device 1. For example, in the case where the substrate 11 is realized by a laminated substrate such as an SOI substrate, the ink chambers 21 can be formed by etching the corresponding portions of the bottom surface of the substrate 11, and the diaphragm 16 and the other structures of the ink nozzle 20 can be formed by processing the substrate 11 per se.

According to the present embodiment, the piezoelectric body 13 is a monocrystal line film formed, above the substrate 11, of an inorganic crystalline compound containing a first ferroelectric crystal when no electric field is applied to the piezoelectric body, and having a characteristic that phase transition of at least a portion of the first ferroelectric crystal to a second ferroelectric crystal occurs when the strength of the electric field is at or above a predetermined level E1, and the first ferroelectric crystal and the second ferroelectric crystal have structures corresponding to different crystal systems.

Figure 7:
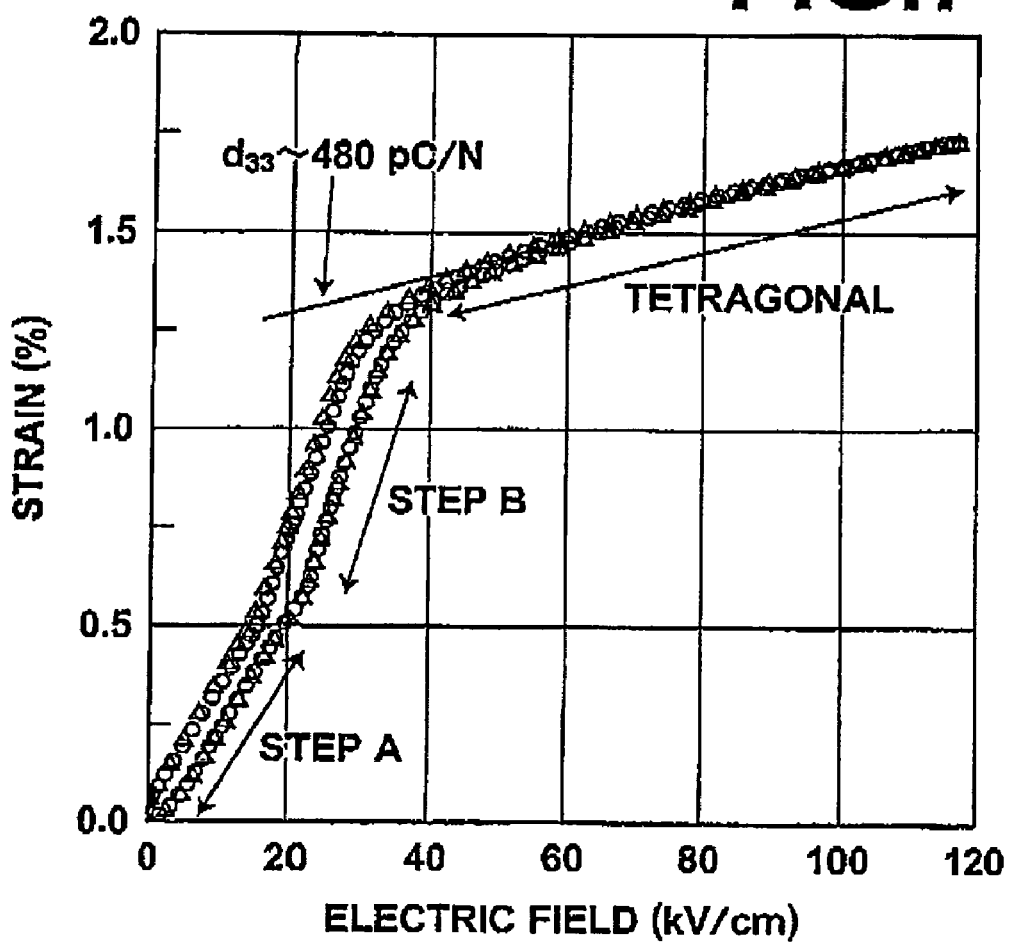
FIG. 7 is a quote from "FIG. 17" in the Park reference, and shows the engineered-domain effect in a monocrystal of PZN-8% PT.

The piezoelectric body 13 has the piezoelectric characteristic (the relationship between the electric field strength and the magnitude of strain) which can be approximately indicated by the curve P in FIG. 2. (See also FIG. 7 (i.e., "FIG. 17" in the Park reference).) In FIG. 2, E1 indicates the minimum electric field strength at which the phase transition from the first ferroelectric crystal to the second ferroelectric crystal begins, and E2 indicates the minimum electric field strength at which the phase transition from the first ferroelectric crystal to the second ferroelectric crystal is almost completed. Although normally E1<E2, E1=E2 in some cases.

In the piezoelectric characteristic indicated in FIG. 2, the magnitude of strain in the piezoelectric body 13 linearly increases with increase in the electric field strength E in the range from 0 to E1 (before the phase transition) because of the engineered-domain effect in the first ferroelectric crystal, increases with increase in the electric field strength E in the range from E1 to E2 at a greater increasing rate than in the range from 0 to E1 because of the change in the crystal structure caused by the phase transition, and linearly increases with increase in the electric field strength E in the range equal to or higher than E2 (after the phase transition) because of the piezoelectric effect in the second ferroelectric crystal.

That is, in the piezoelectric body 13, the change in the crystal structure caused by the phase transition occurs in the range of the electric field strength E from E1 to E2, and the piezoelectric effect works both before and after the phase transition since the piezoelectric body 13 contains ferroelectric crystals both before and after the phase transition. Therefore, it is possible to achieve great strain in each of the ranges of the electric field strength E, $0<E\leq E1$, $E1<E<E2$, and $E\leq E2$.

According to the present embodiment, the controller 15 drives the piezoelectric body 13 having the above characteristic under the condition that the minimum electric field strength Emin, the maximum electric field strength Emax, and the electric field strength E1 satisfy the inequalities (1), $$Emin<E1<Emax, \quad (1)$$

where the minimum electric field strength Emin is determined within a range in which the phase transition does not occur (and may be zero), and the maximum electric field strength Emax is determined within a range in which the phase transition occurs in at least a portion of the piezoelectric body 13. Therefore, in the piezoelectric device according to the present embodiment, both the piezoelectric effect in the first ferroelectric crystal and the volume change caused by the phase transition occurring in the piezoelectric body 13 contribute to the strain, so that it is possible to achieve great strain.

Further, it is preferable that the piezoelectric device be driven under the condition that the minimum electric field strength Emin, the maximum electric field strength Emax, and the electric field strengths E1 and E2 satisfy the inequalities (2), $$Emin<E1\leq E2<Emax. \quad (2)$$

That is, it is preferable that the piezoelectric device be driven so that the minimum electric field strength Emin is within a range in which the phase transition does not occur (and may be zero), and the maximum electric field strength Emax is within a range in which the phase transition from the first ferroelectric crystal to the second ferroelectric crystal is almost completed. Therefore, in this case, all of the piezoelectric effect in the first ferroelectric crystal, the volume change caused by the phase transition occurring in the piezoelectric body 13, and the piezoelectric effect in the second ferroelectric crystal contribute to the strain, so that it is possible to achieve great strain. FIG. 2 shows the piezoelectric characteristic in the case where the minimum electric field strength Emin and the maximum electric field strength Emax satisfy the inequalities (2).

Figure 6:
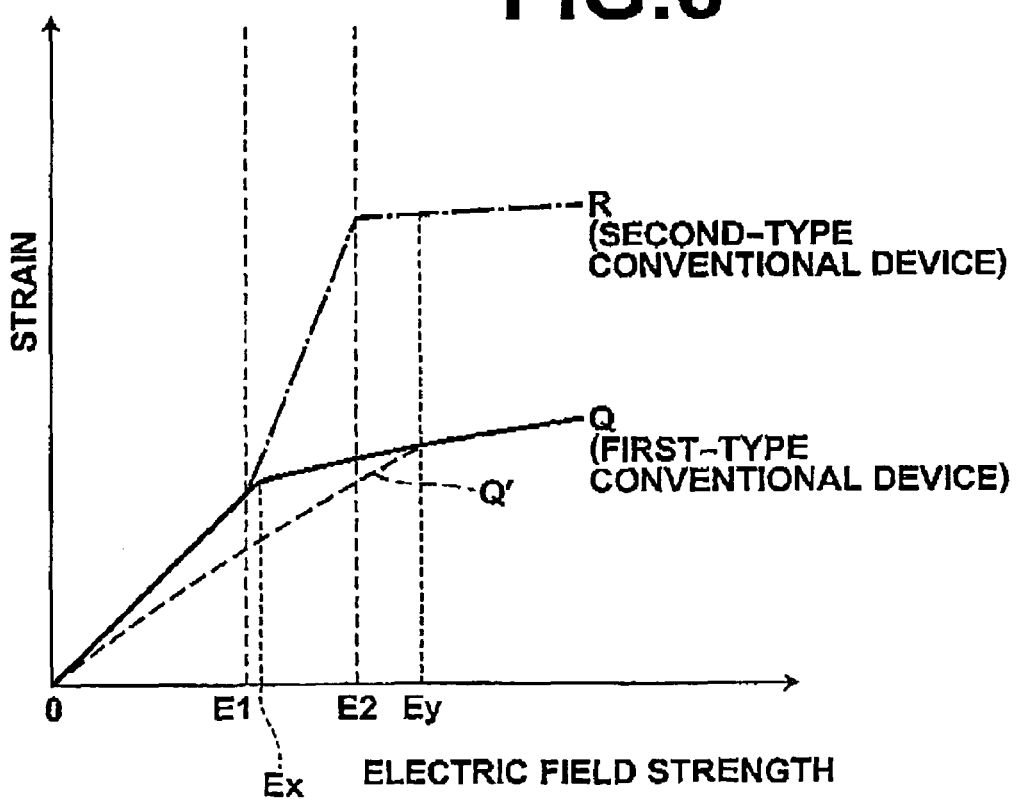
FIG. 6 is a diagram schematically indicating piezoelectric characteristics of piezoelectric bodies in conventional piezoelectric devices.

As explained in the "Description of the Related Art" with reference to FIG. 6, in the aforementioned first type of conventional piezoelectric devices (which utilize only the conventional piezoelectric effect), the magnitude of strain in the ferroelectric substance linearly increases with increase in the strength of the electric field until the electric field strength reaches a certain level Ex, and the increase in the magnitude of strain is greatly reduced and the magnitude of strain is almost saturated when the electric field strength exceeds the certain level Ex. Therefore, the first type of conventional piezoelectric devices have been used within the range of the electric field strength from 0 to Ex (in which the magnitude of strain in the ferroelectric substance linearly increases with increase in the electric field strength).

The electric field strength E1 at which the phase transition begins in the piezoelectric body 13 according to the present embodiment is lower than the electric field strength Ex at which the magnitude of strain is almost saturated in the first type of conventional piezoelectric devices having a piezoelectric body with the same composition as the piezoelectric body 13 (i.e., $E1\leq Ex$).

The piezoelectric device 1 according to the present embodiment is driven in a range of the electric field strength up to or over the maximum electric field strength of the first type of conventional piezoelectric devices (taking advantage of only the conventional piezoelectric effect) which use a piezoelectric body having the same composition as the piezoelectric device 1. Therefore, as explained before, the piezoelectric device 1 can be effectively used even when the piezoelectric body in the piezoelectric device 1 has a reduced thickness, although the electric field strength applied to the piezoelectric body in the piezoelectric device 1 having the reduced thickness is increased even when the voltage applied to the piezoelectric body in the piezoelectric device 1 is unchanged from the piezoelectric body in the first type of conventional piezoelectric devices.

Further, the piezoelectric body 13 may be formed of an inorganic crystalline compound having an additional characteristic that phase transition of at least a portion of the second ferroelectric crystal to a third ferroelectric crystal occurs when the strength of the electric field is further increased after the phase transition of the at least a portion of the first ferroelectric crystal to the second ferroelectric crystal occurs, where the second ferroelectric crystal and the third ferroelectric crystal have structures corresponding to different crystal systems. In this case, phase transition from a ferroelectric crystal to another ferroelectric crystal occurs twice, so that it is possible to achieve further great strain.

The composition of the piezoelectric body 13 is not specifically limited as long as the piezoelectric body 13 is an inorganic crystalline compound having the characteristic according to the present invention. For example, the piezoelectric body 13 may be formed of one or more perovskite oxides, although the piezoelectric body 13 may further contain inevitable impurities. In this case, it is preferable that the one or more perovskite oxides have composition expressed by the compositional formula $ABO_3$, where A represents one or more A-site elements which are one or more of Pb, Ba, La, Sr, Bi, Li, Na, Ca, Cd, Mg, K, and the lanthanide elements, B represents one or more B-site elements which are one or more of Ti, Zr, V, Nb, Ta, Cr, Mo, W, Mn, Sc, Co, Cu, In, Sn, Ga, Zn, Cd, Fe, and Ni, and O represents oxygen. Although the ratio of each of the total molar amount of atoms of the one or more A-site elements and the total molar amount of atoms of the one or more B-site elements to the molar amount of oxygen atoms in each of the one or more perovskite oxides is normally 1:3, the ratio may deviate from 1:3 within a range in which a perovskite structure can be formed.

Specifically, the piezoelectric body 13 may be constituted by one of the lead-containing compounds (1) and the nonlead compounds (2) indicated below, or a mixture of crystals of two or more of the lead-containing compounds (1) and the nonlead compounds (2).

(1) Lead-containing compounds such as lead titanate, lead titanate zirconate (PZT), lead zirconate, lead lanthanum titanate, lead lanthanum titanate zirconate, lead magnesium niobate-lead zirconium titanate, lead nickel niobate-lead zirconium titanate, lead zinc niobate-lead zirconium titanate, and the like (2) Nonlead compounds such as barium titanate, barium strontium titanate, bismuth sodium titanate, bismuth potassium titanate, sodium niobate, potassium niobate, lithium niobate, bismuth aluminate, bismuth gallate, bismuth ferrate, and the like It is further preferable that the piezoelectric body 13 contain metal ions of one or more of Mg, Ca, Sr, Ba, Bi, Nb, Ta, W, Ln, and the like, where Ln represents the lanthanide elements (i.e., La, Ce, Pr, Nd, Sm, Eu, Gd, Tb, Dy, Ho, Er, Tm, Yb, and Lu).

Furthermore, in order to improve the electric characteristics, it is preferable that the piezoelectric body 13 contains ions of one or more of the metals Mg, Ca, Sr, Ba, Bi, Nb, Ta, W, and lanthanide elements. The lanthanide elements include La, Ce, Pr, Nd, Sm, Eu, Gd, Tb, Dy, Ho, Er, Tm, Yb, and Lu.

For example, PZT and the like can have structures corresponding to three different crystal systems, the cubic, tetragonal, and rhombohedral systems, and barium titanate and the like can have structures corresponding to four different crystal systems, the cubic, tetragonal, orthorhombic, and rhombohedral systems.

Since the crystals having a structure corresponding to the cubic system are paraelectric, the first ferroelectric crystal can have a structure corresponding to one of the tetragonal, orthorhombic, and rhombohedral systems, the second ferroelectric crystal can have a structure corresponding to one of the tetragonal, orthorhombic, and rhombohedral systems, and the first and second ferroelectric crystals correspond to different crystal systems. Therefore, in the case where the piezoelectric body 13 is formed of PZT and the like, one of the first and second ferroelectric crystals corresponds to the tetragonal system, and the other of the first and second ferroelectric crystals corresponds to the rhombohedral system.

The Gibbs free energy G of a dielectric substance including a ferroelectric substance is generally expressed as $$G = U + X_i x_i - E_i P_i - TS,$$

where U represents the internal energy, $X_i$ represents the stress, $x_i$ represents the strain, $E_i$ represents the electric field, $P_i$ represents the polarization, T represents the temperature, and S represents the entropy. The crystal system of a dielectric substance having a certain composition is uniquely determined by the stress, the electric field, and the temperature.

FIG. 3 shows relationships between the temperature and the Gibbs free energy G (and the crystal structure) of barium titanate ($BaTiO_3$). The phase-transition temperature at which phase transition occurs between a rhombohedral phase and an orthorhombic phase is approximately −80° C., the phase-transition temperature at which phase transition occurs between an orthorhombic phase and a tetragonal phase is approximately 10° C., and the phase-transition temperature at which phase transition occurs between a tetragonal phase and a cubic phase is approximately 120° C. Although PZT does not have an orthorhombic structure, the relationships between the temperature and the Gibbs free energy G (and the crystal structure) of PZT are basically similar to barium titanate.

The piezoelectric device 1 according to the present embodiment is effective when the thickness of the piezoelectric device 1 is as small as 20 micrometers or less.

The use of the piezoelectric device 1, which is a piezoelectric monocrystalline film, is advantageous in the variety of the material composition, ease of manufacture, cost, freedom of design, and the like, compared with the use of a bulk monocrystal as the piezoelectric body.

As mentioned in the "Description of the Related Art," in the first type of conventional piezoelectric devices (which utilize only the conventional piezoelectric effect), it has been conventionally considered important that the material of the piezoelectric body be designed so that the orientation of the polarization axis coincides with the direction of the applied electric field. That is, if only the conventional piezoelectric effect of the ferroelectric material is utilized as in the first type of conventional piezoelectric devices, the electric field is applied to the piezoelectric body along the direction in which the polarization axis of the first ferroelectric crystal is oriented before the application of the electric field.

On the other hand, in the present embodiment, it is preferable that the orientation of the polarization of the first ferroelectric crystal be differentiated from the direction along which the electric field is applied between the lower electrode 12 and the upper electrode 14, since the engineered-domain effect can work in this case.

As mentioned before, the engineered-domain effect is a phenomenon in which greater strain can be stably achieved in the case where an electric field is applied along a direction different from the orientation of the polarization axis of the first ferroelectric crystal than in the case where the electric field is applied along the orientation of the polarization axis of the first ferroelectric crystal. Because of the engineered-domain effect, the rate of increase in the magnitude of strain with increase in the electric field strength E (i.e., the dielectric constant) in the range from 0 to E1 is greater in the case where the orientation of the polarization of the first ferroelectric crystal is differentiated from the direction of the applied electric field than in the case where the orientation of the polarization of the first ferroelectric crystal is aligned with the direction of the applied electric field.

Further, when the orientation of the polarization of the first ferroelectric crystal is differentiated from the direction of the applied electric field, in particular, when the direction along which the electric field is applied to the piezoelectric body is approximately aligned with the orientation of the polarization axis of the second ferroelectric crystal, additional effects as well as the engineered-domain effect work.

The present inventor has found that the phase transition from the first ferroelectric crystal to the second ferroelectric crystal most efficiently proceeds when the direction of the applied electric field is approximately aligned with the orientation of the polarization axis of the second ferroelectric crystal. The present inventor considers that since the state in which the direction of the applied electric field is aligned with the orientation of the polarization axis is crystallographically stable, the phase transition from the first ferroelectric crystal to the second ferroelectric crystal in the crystallographically stable state can readily occur.

In some cases, the phase transition does not occur in a portion of the first ferroelectric phase even when an electric field strength equal to or higher than the electric field strength E2 is applied to the piezoelectric body. However, since the phase transition efficiently proceeds in the case where the direction of the applied electric field is approximately aligned with the orientation of the polarization axis of the second ferroelectric crystal, it is possible to reduce the portion of the first ferroelectric phase in which the phase transition does not occur when the electric field strength higher than the electric field strength E2 is applied to the piezoelectric body, and it is further possible to make all the first ferroelectric crystal stably transition to the second ferroelectric crystal in some cases. Therefore, in the case where the direction of the applied electric field is approximately aligned with the orientation of the polarization axis of the second ferroelectric crystal, it is possible to stably achieve greater strain in the range of the electric field strength from E1 to E2 than in the case where the direction of the applied electric field is aligned with the orientation of the polarization axis of the first ferroelectric crystal.

Moreover, in the case where the direction of the applied electric field is approximately aligned with the orientation of the polarization axis of the second ferroelectric crystal, the piezoelectric effect also effectively works in the second ferroelectric phase in the range of the electric field strength higher than E2. Therefore, it is possible to stably achieve greater strain in the range of the electric field strength higher than E2 in the case where the direction of the applied electric field is approximately aligned with the orientation of the polarization axis of the second ferroelectric crystal than in the case where the direction of the applied electric field is approximately aligned with the orientation of the polarization axis of the first ferroelectric crystal.

The engineered-domain effect and the additional effects work as long as the direction of the applied electric field is different from the orientation of the polarization axis of the first ferroelectric crystal, and become more prominent as the direction of the applied electric field is closer to the orientation of the polarization axis of the second ferroelectric crystal.

In sum, when the phase transition is caused by applying the electric field along a direction different from the orientation of the polarization axis of the first ferroelectric crystal, and preferably along the orientation of the polarization axis of the second ferroelectric crystal, the following advantages are obtained.

(A) In the range of the electric field strength from 0 to E1, relatively great strain is stably obtained because of the engineered-domain effect.

(B) In the range of the electric field strength from E1 to E2, relatively great strain is stably obtained since the phase transition efficiently occurs.

(C) In the range of the electric field strength higher than E2, relatively great strain is stably obtained since the piezoelectric effect works in the second ferroelectric crystal.

That is, it is possible to achieve great strain in each of the ranges of the electric field strength E, $0<E\leqq E1$, $E1<E<E2$, and $E\leqq E2$.

As mentioned be fore, in consideration that the electric field is normally applied along a direction perpendicular to the upper surface of the piezoelectric film 13 (i.e., the direction of crystal orientation), and the polarization axes of the ferroelectric crystals having crystal structures corresponding to the tetragonal, orthorhombic, and rhombohedral systems are respectively oriented along the <001>, <110>, and <111> axes, the following combinations (c1) to (c6) of the first and second ferroelectric crystals enable the application of the electric field approximately along the orientation of the polarization axis of the second ferroelectric crystal.

(c1) The first ferroelectric crystal is a rhombohedral crystal oriented approximately along the <001> direction, and the second ferroelectric crystal is a tetragonal crystal.

(c2) The first ferroelectric crystal is a tetragonal crystal oriented approximately along the <111> direction, and the second ferroelectric crystal is a rhombohedral crystal.

(c3) The first ferroelectric crystal is an orthorhombic crystal oriented approximately along the <001> direction, and the second ferroelectric crystal is a tetragonal crystal.

(c4) The first ferroelectric crystal is a tetragonal crystal oriented approximately along the <110> direction, and the second ferroelectric crystal is an orthorhombic crystal.

(c5) The first ferroelectric crystal is a rhombohedral crystal oriented approximately along the <110> direction, and the second ferroelectric crystal is an orthorhombic crystal.

(c6) The first ferroelectric crystal is an orthorhombic crystal oriented approximately along the <111> direction, and the second ferroelectric crystal is a rhombohedral crystal.

It is preferable that the piezoelectric device 1 according to the present embodiment be designed so that the phase transition from the first ferroelectric crystal to the second ferroelectric crystal can be caused by only changing the electric field strength applied to the piezoelectric body 13. That is, it is preferable that a combination of the first and second ferroelectric crystals and the composition of the piezoelectric body 13 be determined so that the phase transition can be induced by application of an electric field at the operational temperature of the piezoelectric device 1, although the operational temperature of the piezoelectric device 1 can be adjusted so that the phase transition can occur in the piezoelectric body 13, when necessary. In either case, it is preferable to operate the piezoelectric device 1 at or near the phase-transition temperature, since the phase transition from the first ferroelectric crystal to the second ferroelectric crystal can be efficiently caused at such a temperature.

Conventionally, the piezoelectric devices have been used at the ordinary temperature in many cases, and have been therefore designed for the use at the ordinary temperature. However, the piezoelectric devices can be required to be used in either of the high-temperature and low-temperature environments. For example, the temperature around the car engines and CPUs can be 80° C., the temperature in inkjet recording heads can be raised to 40° C. to 80° C. for reducing the ink viscosity, and the piezoelectric devices may be used even in refrigerators. Specifically, it is preferable to design the materials of the piezoelectric devices for use in the temperature range of −50° C. to 200° C. Therefore, it is preferable that the phase-transition temperature in the phase transition from the first ferroelectric crystal to the second ferroelectric crystal in the piezoelectric body 13 be in the temperature range of −50° C. to 200° C.

In the case where the piezoelectric body 13 is formed of PZT, and the first ferroelectric crystal is a rhombohedral crystal oriented approximately along the <100> direction, and the second ferroelectric crystal is the tetragonal crystal, and the piezoelectric device 1 is used at the phase-transition temperature, for example, the electric field strength E1 is approximately 10 to 150 kV/cm, and the electric field strength E2 is approximately 30 to 300 kV/cm, although the electric field strengths E1 and E2 depend on the composition and the thickness of the piezoelectric body 13.

As mentioned before, the piezoelectric device 1 according to the present embodiment is driven in a range of the electric field strength up to or over the maximum electric field strength Emax (>E1) of the first type of conventional piezoelectric devices (taking advantage of only the conventional piezoelectric effect) which use a piezoelectric body having the same composition as the piezoelectric device 1. (For example, although the maximum electric field strengths of the first type of conventional piezoelectric devices are normally 0.1 to 10 kV/cm, and the piezoelectric device 1 according to the present embodiment may be driven in the range of the electric field strength up to 100 kV/cm or higher.) Therefore, the piezoelectric device 1 can be effectively used even when the piezoelectric body in the piezoelectric device 1 has a reduced thickness, although the electric field strength applied to the piezoelectric body in the piezoelectric device 1 having the reduced thickness is increased even when the voltage applied to the piezoelectric body in the piezoelectric device 1 is unchanged from the first type of conventional piezoelectric devices.

Although the stress imposed on the piezoelectric film includes the internal stress produced by the film formation process and the stress produced by the difference in the thermal expansion coefficient between the piezoelectric film and the substrate, the materials of the piezoelectric device 1 may be designed so that the stress imposed on the piezoelectric film is −10 to +10 GPa.

2. INKJET RECORDING APPARATUS

Figure 4:
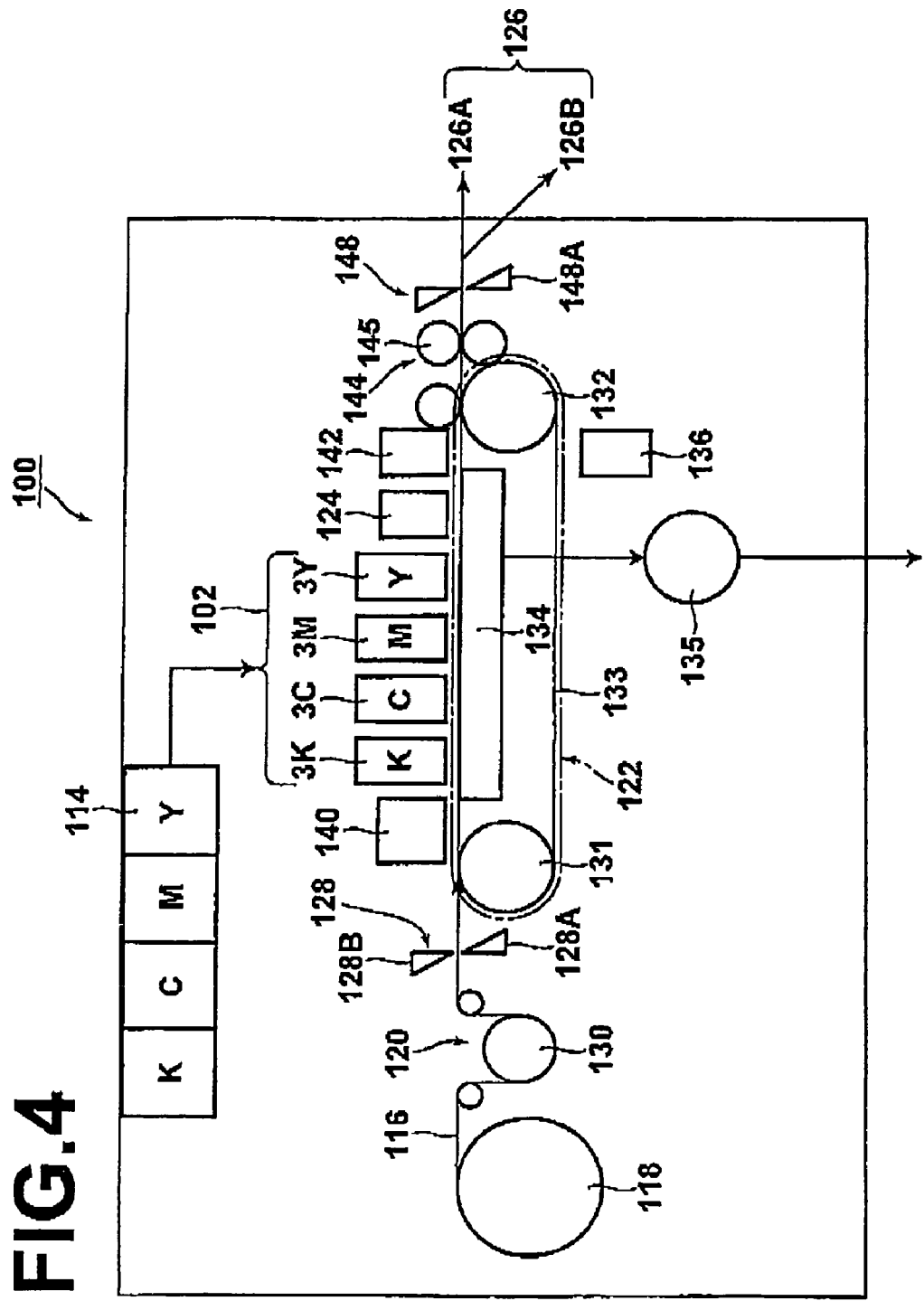
FIG. 4 is a schematic diagram of an example of an inkjet recording apparatus having the inkjet recording head of FIG. 1.
Figure 5:
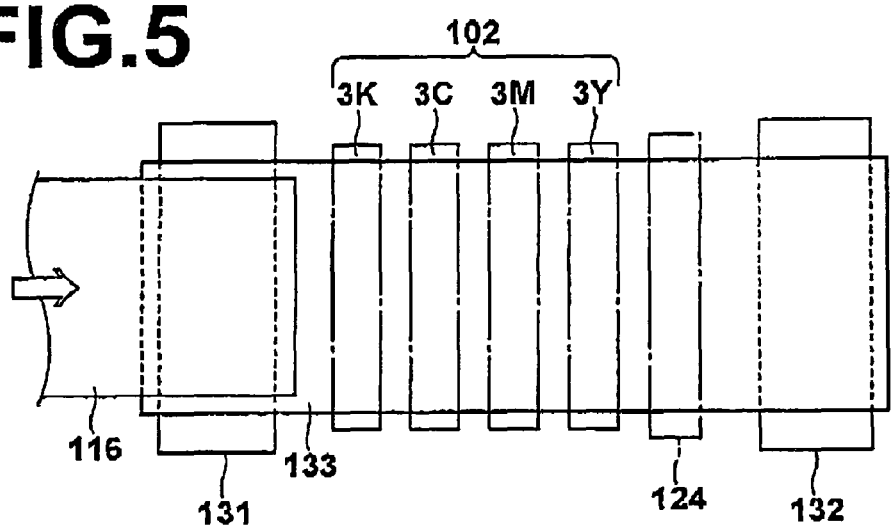
FIG. 5 is a top view of a portion of the inkjet recording apparatus of FIG. 4.

Hereinbelow, an example of an inkjet recording apparatus having the inkjet recording head 3 is explained with reference to FIGS. 4 and 5. FIG. 4 is a schematic diagram illustrating an outline of an example of an inkjet recording apparatus having the inkjet recording head 3 of FIG. 1, and FIG. 5 is a top view of a portion of the inkjet recording apparatus of FIG. 4.

As schematically illustrated in FIG. 4, the inkjet recording apparatus 100 comprises a printing unit 102, an ink reserve-and-load unit 114, a sheet feeding unit 118, a decurling unit 120, a suction-type belt conveyer 122, a print detection unit 124, and a sheet output unit 126. The printing unit 102 comprises a plurality of inkjet recording heads 3K, 3C, 3M, and 3Y corresponding to inks of different colors (specifically, black (K), cyan (C), magenta (M), and yellow (Y)). Hereinafter, the inkjet recording heads may be referred to as heads. The ink reserve-and-load unit 114 reserves the inks to be supplied to the heads 3K, 3C, 3M, and 3Y. The sheet feeding unit 118 feeds a recording sheet 116. The decurling unit 120 eliminates curl of the recording sheet 116. The suction-type belt conveyer 122 is arranged to face the nozzle faces (ink-discharge faces) of the printing unit 102, and conveys the recording sheet 116 while maintaining the flatness of the recording sheet 116. The print detection unit 124 reads an image printed on the recording sheet 116 by the printing unit 102. The sheet output unit 126 externally outputs a printed recording sheet 116.

Each of the heads 3K, 3C, 3M, and 3Y constituting the printing unit 102 corresponds to the inkjet recording head according to the present embodiment as explained before, although, in order to realize a linear head (explained later), each inkjet recording head used in the inkjet recording apparatus 100 comprises a plurality of piezoelectric devices on the lower electrode 13, and a plurality of ink chambers and a plurality of ink outlets are arranged in correspondence with the arrangement of the plurality of piezoelectric devices on the lower electrode 13.

The decurling unit 120 performs decurling of the recording sheet 116 by heating the recording sheet 116 with a heating drum 130 so as to eliminate the curl produced in the sheet feeding unit 118.

In the case where the inkjet recording apparatus 100 uses roll paper, a cutter 128 for cutting the roll paper into desired size is arranged in the stage following the decurling unit 120. The cutter 128 is constituted by a fixed blade 128A and a round blade 128B. The fixed blade 128A has a length equal to or greater than the width of the conveying path of the recording sheet 116, and is arranged on the side opposite to the print side of the recording sheet 116. The round blade 128B is arranged opposite to the fixed blade 128A on the print side of the recording sheet 116, and moves along the fixed blade 128A. In the inkjet recording apparatuses using cut paper, the cutter 128 is unnecessary.

After the roll paper is decurled and cut into the recording sheet 116, the recording sheet 116 is transferred to the suction-type belt conveyer 122. The suction-type belt conveyer 122 is constituted by rollers 131 and 132 and an endless belt 133. The rollers 131 and 132 are placed apart and the endless belt 133 is looped around the rollers 131 and 132 in such a manner that at least portions of the endless belt 133 which face the nozzle faces of the printing unit 102 and the sensor face of the print detection unit 124 are flat and horizontal.

The endless belt 133 has a width greater than the width of the recording sheet 116, and a great number of suction pores (not shown) are formed through the endless belt 133. A suction chamber 134 is arranged inside the loop of the endless belt 133 at the position opposite to the nozzle faces of the printing unit 102 and the sensor face of the print detection unit 124, and suctioned by a fan 135, so that a negative pressure is generated in the suction chamber 134, and the recording sheet 116 on the endless belt 133 is held by suction.

The power of a motor (not shown) is transmitted to at least one of the rollers 131 and 132 so that the endless belt 133 is driven clockwise in FIG. 4, and the recording sheet 116 held on the endless belt 133 is moved from left to right in FIG. 4.

In the case of borderless printing, ink can be deposited on the endless belt 133. Therefore, in order to clean the endless belt 133, a belt cleaning unit 136 is arranged at a predetermined (appropriate) position outside the loop of the endless belt 133 and the printing region.

A heating fan 140 is arranged on the upstream side of the printing unit 102 above the conveying path of the recording sheet 116 (which is realized by the suction-type belt conveyer 122). The heating fan 140 blows heated air to the recording sheet 116 before printing so as to heat the recording sheet 116 and facilitate drying of deposited ink.

Each of the heads 3K, 3C, 3M, and 3Y in the printing unit 102 is a so-called full-line type head, which is a linear head having a length corresponding to the maximum width of the recording sheet 116, and being arranged across the width of the recording sheet 116 (i.e., in the main scanning direction perpendicular to the feeding direction of the recording sheet 116) as illustrated in FIG. 5. Specifically, each of the heads 3K, 3C, 3M, and 3Y is a linear head in which the aforementioned plurality of ink-discharge outlets (nozzles) are arrayed over a length exceeding the maximum length of a side of the largest recording sheet 116 on which the inkjet recording apparatus 100 can print an image. The heads 3K, 3C, 3M, and 3Y corresponding to the inks of the different colors are arrayed upstream in this order along the feeding direction as illustrated in FIG. 5. Thus, a color image can be printed on the recording sheet 116 by discharging the inks of the different colors while conveying the recording sheet 116.

The print detection unit 124 may be constituted by, for example, a line sensor which takes an image formed of spots of the inks discharged from the printing unit 102, and detects, from the image taken by the line sensor, incomplete discharge, which can be caused by clogging of a nozzle or the like.

A rear drying unit 142 for drying the printed surface of the recording sheet 116 is arranged in the stage following the print detection unit 124. For example, the rear drying unit 142 is realized by a heating fan or the like. Since it is preferable to avoid contact with the printed surface before the ink on the printed surface is completely dried, it is preferable that the rear drying unit 142 dry the ink on the printed surface by blowing heated air.

In order to control the glossiness of the image printed on the recording sheet 116, a heating-and-pressurizing unit 144 is arranged in the stage following the rear drying unit 142. The heating-and-pressing unit 144 comprises a pressure roller 145 with a surface having predetermined projections and depressions, and transfers the predetermined projections and depressions to the printed surface of the recording sheet 116 by pressing the printed surface with the pressure roller 145 while heating the printed surface.

Finally, the printed recording sheet 116 produced as above is outputted from the sheet output unit 126. It is preferable to separately output test prints and prints for practical use. Therefore, the sheet output unit 126 includes a first output unit 126A for the prints for practical use and a second output unit 126B for the test prints. Although not shown, the inkjet recording apparatus 100 further comprises a sorting unit which sorts the printed recording sheets 116 into the test prints and the prints for practical use, and sends the test prints to the first output unit 126B, and the prints for practical use to the second output unit 126A.

Further, in the case where both of a test image and an image for practical use are concurrently printed on a recording sheet 116, it is possible to arrange a cutter 148, and separate a first portion of the recording sheet 116 on which the test image is printed and a second portion of the recording sheet 116 on which the image for practical use is printed.

3. CONCRETE EXAMPLES OF THE PRESENT INVENTION

The present inventor has produced concrete examples of the piezoelectric device according to the present invention and a comparison example of the conventional piezoelectric device as indicated below.

3.1 Concrete Example 1

The concrete example 1 of the piezoelectric device according to the present invention has been produced as follows.

First, a lower electrode of $SrRuO_3$ having a thickness of 0.2 micrometers has been formed on a (100) substrate of $SrTiO_3$ by pulsed-laser deposition (PLD) at the substrate temperature of 700° C., and epitaxial growth of the $SrRuO_3$ film has been confirmed by RHEED (reflection high energy electron diffraction). Then, a thin film of $PbZr_{0.55}Ti_{0.45}O_3$ having a thickness of 5 micrometers has been formed as the piezoelectric body on the lower electrode by PLD, and monocrystallinity of the PZT film has been confirmed by reciprocal lattice mapping in X-ray diffraction. Further, an upper electrode of platinum having a thickness of 0.2 micrometers has been formed on the piezoelectric film by sputtering. Thus, the concrete example 1 of the piezoelectric device according to the present invention has been obtained.

Further, XRD (X-ray diffraction) measurement of the piezoelectric film has been performed while changing the electric field applied to the piezoelectric film. The XRD measurement which has been performed without application of an electric field indicates that the piezoelectric device (i.e., the first ferroelectric crystal) is a rhombohedral crystal which is oriented along the <001> direction when no electric field is applied. In addition, XRD (X-ray diffraction) measurement of the piezoelectric film which has been performed while applying an electric field indicates that phase transition from the rhombohedral crystal (as the first ferroelectric crystal) to a tetragonal crystal (as the second ferroelectric crystal) occurs when an electric field is applied to the piezoelectric film along the <001> direction. In the concrete example 1, the direction along which the electric field is applied coincides with the orientation of the polarization axis of the second ferroelectric crystal after the phase transition.

Furthermore, the electric field strength E1 at which the phase transition from the first ferroelectric crystal to the second ferroelectric crystal begins has been measured to be 50 kV/cm, and the electric field strength E2 at which the phase transition from the first ferroelectric crystal to the second ferroelectric crystal is substantially completed has been measured to be 90 kV/cm.

Moreover, the piezoelectric coefficient d31 in the range of the electric field strength between the minimum electric field strength Emin of 20 kV/cm (<E1) and the maximum electric field strength Emax of 150 kV/cm (>E2) has been measured by using a cantilever to be 200 pm/V. Thus, it has been confirmed that the electric field strengths E1 and E2, the minimum electric field strength Emin, and the maximum electric field strength Emax satisfy the aforementioned inequalities (2).

3.2 Concrete Example 2

The concrete example 2 of the piezoelectric device according to the present invention has been produced as follows.

Figure 8:
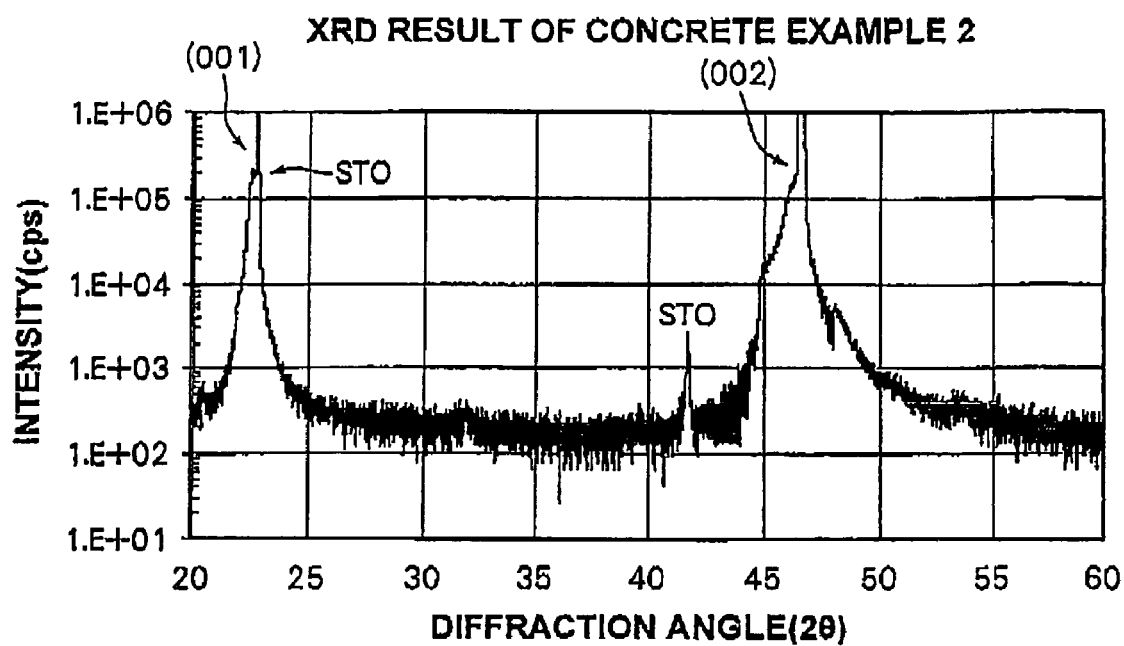
FIG. 8 is a diagram indicating results of XRD measurement of a piezoelectric film in a concrete example 2.

First, a lower electrode of $SrRuO_3$ having a thickness of 0.2 micrometers has been formed on a (100) substrate of $SrTiO_3$ by PLD at the substrate temperature of 700° C., and epitaxial growth of the $SrRuO_3$ film has been confirmed by RHEED. Then, a thin film of $(Bi_{0.85}La_{0.15})(Fe_{0.4}Al_{0.6})O_3$ having a thickness of 600 nm has been formed as the piezoelectric body on the lower electrode by PLD by using a target of $(Bi_{0.85}La_{0.15})(Fe_{0.4}Al_{0.6})O_3$ under the condition that the laser intensity is 350 mJ, the laser pulse frequency is 5 Hz, the partial pressure of oxygen is 50 mmTorr, the substrate-target distance is 50 mm, the rotational speed of the target is 9.7 rpm, and the substrate temperature is 585° C. After the formation of the piezoelectric film, XRD (X-ray diffraction) measurement of the piezoelectric film has been performed, and the result of the XRD measurement shows that the piezoelectric film is a (001)-oriented single-phase perovskite film as indicated in FIG. 8.

Next, an upper electrode of platinum (Pt) having a thickness of 150 nm has been formed on the above piezoelectric film of (Bi, La)(Fe, Al)$O_3$ by evaporation. Thus, the concrete example 2 of the piezoelectric device according to the present invention has been obtained. Then, the bipolar polarization-electric field characteristic (i.e., the P-E hysteresis characteristic) of the piezoelectric film has been measured by applying a voltage to the piezoelectric film. The measurement has been performed under the condition that the frequency of the applied voltage is 10 kHz, and the maximum electric field applied to the piezoelectric film is 123 kV/cm. The obtained P-E hysteresis characteristic has been confirmed as exhibiting satisfactory squareness. Thus, satisfactory ferroelectricity of the piezoelectric film in the concrete example 2 has been confirmed.

Figure 9:
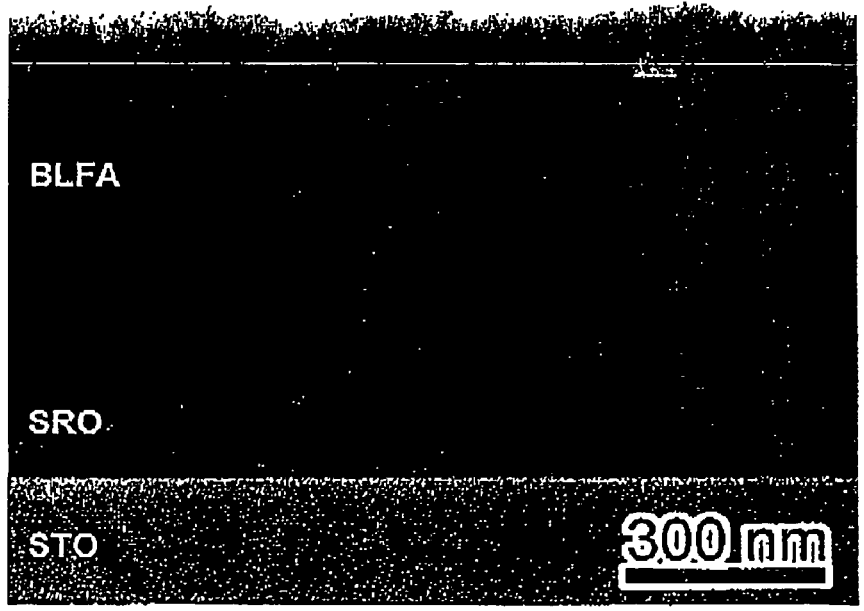
FIG. 9 is a diagram indicating a cross-sectional TEM micrograph of the piezoelectric film in the concrete example 2.

In addition, a cross-sectional TEM (transmission electron microscopy) micrograph of the above piezoelectric film has been observed as indicated in FIG. 9, and an electron-beam diffraction pattern of the piezoelectric film has been observed by TEM at [100] incidence as indicated in FIG. 10 (where the diameter of the selected-area aperture is 200 nm).

As indicated in FIG. 10, a clear lattice image has been observed in the electron-beam diffraction pattern of the piezoelectric film. That is, it has been confirmed that the piezoelectric film in the concrete example 2 is a satisfactory monocrystalline film.

Further, XRD measurement of the piezoelectric film has been performed while changing the electric field applied to the piezoelectric film by using the XRD system D8 DISCOVER (available from Bruker AXS K.K.). In the measurement, the diameter of the incident X ray beam is 300 micrometers, and the repeatability of the initial peak position has been confirmed by changing the voltage applied to the piezoelectric film as DC 10 V→0 V→9 V→0V. Thereafter, the peak shift amount has been measured while gradually increasing the voltage applied to the piezoelectric film to 9 V. Further details of the measurement condition are as follows.

Goniometer; XRD system D8 DISCOVER (Bruker AXS)

Attachment: a thin-film specimen table & a voltage application probe

Scanning Mode: a two-dimensional detector and the incident angle are fixed

X ray: 45 kV/110 mA CuKa (with a graphite monochromator)

Attenuator; No

Collimator Diameter: 0.3 mm

Camera Length: 30 cm

Sampling Step: 0.02 degrees

Exposure Time: 5 to 10 seconds in epitaxial films
1 to 3 minutes in uniaxially oriented films FIG. 11 shows part of the results of the above XRD measurement which have been observed when the DC voltage applied to the piezoelectric film is 0, 8, and 9 V. As indicated in FIG. 11, the peak shift is small in the range of the applied voltage from 0 to 8V. (For this reason, the results of the above XRD measurement at the applied voltage between 0 and 8 V are not shown in FIG. 11.) However, the peak shift observed when the applied voltage of is 9 V is definitely greater than the peak shift in the range of the applied voltage from 0 to 8 V. The present inventor considers that although the peak shift observed in the range of the applied voltage from 0 to 8 V corresponds to the strain caused by the (conventional) piezoelectric effect, the great peak shift observed when the applied voltage of is 9 V corresponds to the great strain caused by the phase transition.

Figure 12:
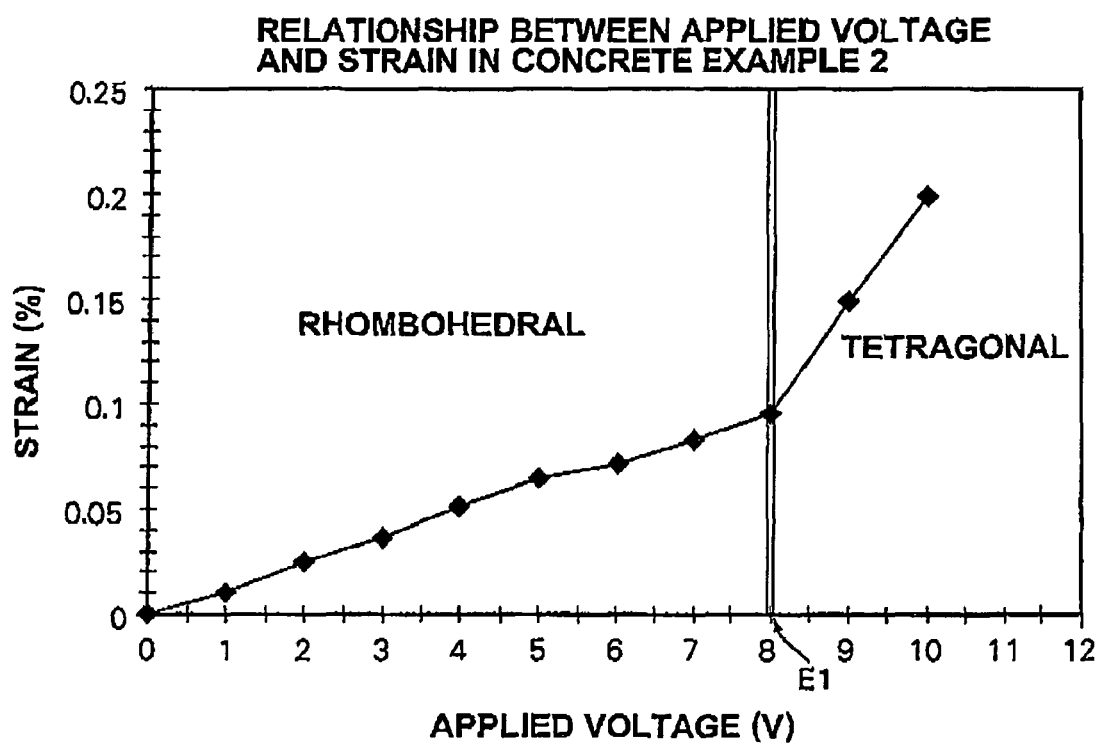
FIG. 12 is a diagram indicating a relationship between the electric field applied to the piezoelectric film in the concrete example 2 and strain in the piezoelectric film.

Furthermore, the relationship between the magnitude of strain (in percentages) and the applied voltage (in volts) has been measured on the basis of the change in the lattice constant observed by XRD measurement. FIG. 12 shows the result of the measurement. As indicated in FIG. 12, an inflection point has been observed at the applied voltage of 8 V. That is, the electric field strength E1 at which the phase transition begins has been detected at the applied voltage of 8 V.

The results of all of the above measurement indicate that the piezoelectric film of (Bi, La)(Fe, Al)$O_3$ in the concrete example 2 is a rhombohedral crystal oriented along the <001> direction (as the first ferroelectric crystal) when no electric field is applied to the piezoelectric film, and phase transition from the rhombohedral crystal to a tetragonal crystal (as the second ferroelectric crystal) occurs when an electric field is applied to the piezoelectric film along the <001> direction, where the direction of the applied electric field coincides with the polarization axis of the crystal after the phase transition.

3.3 Comparison Example

The comparison example of the piezoelectric device has been produced as follows.

The piezoelectric device as the comparison example is different from the concrete example 1 only in that the substrate is a (111) substrate of $SrTiO_3$, and the lower electrode is a (111)-oriented film of $SrRuO_3$.

After the formation of the piezoelectric film, XRD (X-ray diffraction) measurement of the piezoelectric film has been performed while changing the electric field applied to the piezoelectric film. The XRD measurement which has been performed without application of an electric field indicates that the piezoelectric device (i.e., the first ferroelectric crystal) is a rhombohedral crystal which is oriented along the <111> direction (along which the polarization axis is also oriented) when no electric field is applied. However, phase transition has not been observed in the XRD measurement even when the same electric fields as the concrete example 1 are applied to the piezoelectric film. Further, measurement of the piezoelectric coefficient d31 in the range of the electric field strength between the minimum electric field strength Emin of 20 kV/cm and the maximum electric field strength Emax of 150 kV/cm has been performed by using a cantilever in a similar manner to the concrete example 1, and the piezoelectric coefficient d31 in the comparison example has been observed to be 130 pm/V.

4. INDUSTRIAL USABILITY

The piezoelectric device according to the present invention can be preferably used in piezoelectric actuators, ferroelectric memories (FRAMs), and the like, where the piezoelectric actuators may be mounted in the inkjet recording heads, the magnetic recording-and-reproduction heads, MEMS (micro electromechanical systems) devices, micropumps, ultrasonic probes, and the like.

What is claimed is:

1. A piezoelectric device comprising,
a piezoelectric body, and
electrodes through which an electric field having strength is applied to the piezoelectric body along a predetermined direction;
wherein said piezoelectric body is a monocrystalline film formed, above a substrate, of an inorganic crystalline compound containing a first ferroelectric crystal when no electric field is applied to the piezoelectric body, and having a characteristic that phase transition of at least a portion of the first ferroelectric crystal to a second ferroelectric crystal occurs when the strength of said electric field is at or above a predetermined level E1, the first ferroelectric crystal and the second ferroelectric crystal have structures corresponding to different crystal systems, and said piezoelectric device is driven under a condition that a minimum strength Emin, a maximum strength Emax, and the predetermined level E1 of the electric field applied to the piezoelectric body satisfy the inequalities, Emin<E1<Emax.

2. A piezoelectric device according to claim 1, being arranged to be driven under a condition that the minimum strength Emin, the maximum strength Emax, and the predetermined level E1 of the electric field applied to the piezoelectric body satisfy the inequalities, Emin<E1≦E2<Emax, where E2 represents the strength of the electric field at which said phase transition to said second ferroelectric crystal is substantially completed.

3. A piezoelectric device according to claim 1, wherein said first ferroelectric crystal has a polarization axis oriented along a direction different from said predetermined direction.

4. A piezoelectric device according to claim 3, wherein said second ferroelectric crystal has a polarization axis oriented along a direction approximately identical to said predetermined direction.

5. A piezoelectric device according to claim 1, wherein said first ferroelectric crystal has a crystal structure corresponding to a first one of tetragonal, orthorhombic, monoclinic, and rhombohedral crystal systems, said second ferroelectric crystal has a crystal structure corresponding to a second one of tetragonal, orthorhombic, monoclinic, and rhombohedral crystal systems, and the first one of the tetragonal, orthorhombic, monoclinic, and rhombohedral crystal systems is different from the second one of the tetragonal, orthorhombic, monoclinic, and rhombohedral crystal systems.

6. A piezoelectric device according to claim 5, wherein said first ferroelectric crystal is a rhombohedral crystal oriented approximately along a <001> direction, and the second ferroelectric crystal is a tetragonal crystal.

7. A piezoelectric device according to claim 5, wherein said first ferroelectric crystal is a tetragonal crystal oriented approximately along a <111> direction, and the second ferroelectric crystal is a rhombohedral crystal.

8. A piezoelectric device according to claim 5, wherein said first ferroelectric crystal is an orthorhombic crystal oriented approximately along a <001> direction, and the second ferroelectric crystal is a tetragonal crystal.

9. A piezoelectric device according to claim 5, wherein said first ferroelectric crystal is a tetragonal crystal oriented approximately along a <110> direction, and the second ferroelectric crystal is an orthorhombic crystal.

10. A piezoelectric device according to claim 5, wherein said first ferroelectric crystal is a rhombohedral crystal oriented approximately along a <110> direction, and the second ferroelectric crystal is an orthorhombic crystal.

11. A piezoelectric device according to claim 5, wherein first ferroelectric crystal is an orthorhombic crystal oriented approximately along a <111> direction, and the second ferroelectric crystal is a rhombohedral crystal.

12. A piezoelectric device according to claim 1, wherein said piezoelectric body is composed of one or more perovskite oxides.

13. A piezoelectric device according to claim 12, wherein each of said one or more perovskite oxides has composition expressed by a compositional formula $ABO_3$, A represents one or more A-site elements which are one or more of Pb, Ba, La, Sr, Bi, Li, Na, Ca, Cd, Mg, K, and the lanthanide elements, B represents one or more B-site elements which are one or more of Ti, Zr, V, Nb, Ta, Cr, Mo, W, Mn, Sc, Co, Cu, In, Sn, Ga, Zn, Cd, Fe, and Ni, O represents oxygen, and the ratio of each of the total molar amount of atoms of the one or more A-site elements and the total molar amount of atoms of the one or more B-site elements to the molar amount of oxygen atoms in each of said one or more perovskite oxides may deviate from 1:3 within a range in which a perovskite structure can be formed.

14. A piezoelectric device according to claim 1, wherein said phase transition occurs at the temperature range of −50° C. to 200° C.

15. A piezoelectric device according to claim 1, wherein said piezoelectric film has a thickness of 20 micrometers or smaller.

16. A piezoelectric device according to claim 1, wherein said inorganic crystalline compound further has an additional characteristic that phase transition of at least a portion of the second ferroelectric crystal to a third ferroelectric crystal occurs when the strength of said electric field is further increased after said phase transition of said at least a portion of the first ferroelectric crystal to the second ferroelectric crystal occurs, and the second ferroelectric crystal and the third ferroelectric crystal have structures corresponding to different crystal systems.

17. A process for driving a piezoelectric device which has a piezoelectric body, and electrodes through which an electric field having strength is applied to the piezoelectric body along a predetermined direction;
wherein said piezoelectric device is driven under a condition that a minimum strength Emin, a maximum strength Emax, and a predetermined level E1 of the electric field applied to the piezoelectric body satisfy the inequalities, Emin<E1<Emax; and where said piezoelectric body is a monocrystalline film formed, above a substrate, of an inorganic crystalline compound containing a first ferroelectric crystal when no electric field is applied to the piezoelectric body, and having a characteristic that phase transition of at least a portion of the first ferroelectric crystal to a second ferroelectric crystal occurs when the strength of said electric field is at or above the predetermined level E1, and the first ferroelectric crystal and the second ferroelectric crystal have structures corresponding to different crystal systems.

18. A process according to claim 17, wherein said piezoelectric device is driven under a condition that the minimum strength Emin, the maximum strength Emax, and the predetermined level E1 of the electric field applied to the piezoelectric body satisfy the inequalities, Emin<E1≦E2<Emax, where E2 represents the strength of the electric field at which said phase transition to said second ferroelectric crystal is substantially completed.

19. A piezoelectric actuator comprising a piezoelectric device and a controller for controlling driving of the piezoelectric device, wherein the piezoelectric device includes,
a piezoelectric body, and
electrodes through which an electric field having strength is applied to the piezoelectric body along a predetermined direction;
said piezoelectric body is a monocrystalline film formed, above a substrate, of an inorganic crystalline compound containing a first ferroelectric crystal when no electric field is applied to the piezoelectric body, and having a characteristic that phase transition of at least a portion of the first ferroelectric crystal to a second ferroelectric crystal occurs when the strength of said electric field is at or above a predetermined level E1, and the first ferroelectric crystal and the second ferroelectric crystal have structures corresponding to different crystal systems; and said controller drives said piezoelectric device under a condition that a minimum strength Emin, a maximum strength Emax, and the predetermined level E1 of the electric field applied to the piezoelectric body satisfy the inequalities, $Emin < E1 < Emax$.

20. A piezoelectric actuator according to claim 19, wherein said controller drives said piezoelectric device under a condition that the minimum strength Emin, the maximum strength Emax, and the predetermined level E1 of the electric field applied to the piezoelectric body satisfy the inequalities, $Emin < E1 \leq E2 < Emax$, where E2 represents the strength of the electric field at which said phase transition to said second ferroelectric crystal is substantially completed.

21. A liquid discharge device comprising:
said piezoelectric device according to claim 19; and
a reserve-and-discharge member including,
    a liquid-reserve chamber which reserves liquid, and
    a liquid-discharge outlet through which said liquid is discharged from the liquid-reserve chamber.

22. A liquid discharge device comprising:
said piezoelectric device according to claim 20; and
a reserve-and-discharge member including,
    a liquid-reserve chamber which reserves liquid, and
    a liquid-discharge outlet through which said liquid is discharged from the liquid-reserve chamber.

* * * * *